(12) United States Patent
Yabe et al.

(10) Patent No.: US 6,611,011 B2
(45) Date of Patent: Aug. 26, 2003

(54) MEMORY CELL ARRAY DIVIDED INTO A PLURALITY OF SUBARRAYS ARRANGED IN MATRIX FORM

(75) Inventors: Tomoaki Yabe, Kawasaki (JP); Atsushi Kawasumi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/228,079

(22) Filed: Aug. 27, 2002

(65) Prior Publication Data

US 2003/0042553 A1 Mar. 6, 2003

(30) Foreign Application Priority Data

Aug. 29, 2001 (JP) ......................................... 2001-260231

(51) Int. Cl.⁷ ............................................. H01L 27/10
(52) U.S. Cl. ...................................... 257/210; 257/208
(58) Field of Search ................................. 257/203, 207, 257/208, 209, 210, 390

(56) References Cited

U.S. PATENT DOCUMENTS

| 5,109,265 A | * | 4/1992 | Utesch et al. ................ 257/786 |
| 5,898,636 A | * | 4/1999 | Isomura et al. ........ 365/230.03 |
| 5,995,404 A | | 11/1999 | Nakaumura et al. |
| 6,291,844 B1 | * | 9/2001 | Aoki ........................... 257/209 |

* cited by examiner

*Primary Examiner*—Ngân V. Ngô
(74) *Attorney, Agent, or Firm*—Finnegan, Henderson, Farabow, Garrett & Dunner, L.L.P.

(57) ABSTRACT

A semiconductor memory device assembled in a flip chip package includes a memory cell array divided into subarrays arranged in matrix form, and a peripheral circuit area and a pad area formed in middle sections of the subarray matrix. The pad area includes pads arranged at the same pitches as those of the subarrays, and a signal connecting the peripheral circuit area and each of the subarrays is linearly formed so as to pass between the pads. The variations of delay time of signals supplied to the subarrays are avoided and the transmission time of signals is kept constant, thereby achieving a high-speed operation.

17 Claims, 4 Drawing Sheets

MEMORY CELL ARRAY DIVIDED INTO A PLURALITY OF SUBARRAYS ARRANGED IN MATRIX FORM

CROSS-REFERENCE TO RELATED APPLICATIONS

This application is based upon and claims the benefit of priority from the prior Japanese Patent Application No. 2001-260231, filed Aug. 29, 2001, the entire contents of which are incorporated herein by reference.

BACKGROUND OF THE INVENTION

1. Field of the Invention

The present invention relates to a semiconductor memory device. More specifically, the invention relates to a semiconductor memory assembled in a flip chip package wherein a memory cell array is divided into a plurality of subarrays arranged in matrix form and external connection pads are placed in a middle section of the subarray matrix, and to the arrangement of pads and control signal lines in a memory chip. The flip chip package semiconductor memory is applied to a high-speed SPAM (Static Random Access Memory) and the like.

2. Description of the Related Art

A flip chip package type semiconductor memory is widely used in a high-speed SRAM and the like because the degree of freedom of arrangement of pads on a memory chip is high and thus the pads can be scattered on a memory cell array (or between subarrays).

The pattern layout of a prior art memory chip assembled in a flip chip package will now be described with reference to FIG. 1. The memory chip shown in FIG. 1 includes a memory cell array that is divided into a plurality of subarrays arranged in matrix form. For example, the memory cell array is divided into subarrays $SA_{1,1}$ to $SA_{16,16}$ of a matrix with 16 rows and 16 columns. Thus, the j-th subarray column (j is an integer smaller than 17) includes sixteen subarrays $SA_{j,1}$ to $SA_{j,16}$. Hereinafter, the column numbers of matrix elements are each represented by a first suffix and the row numbers thereof are each represented by a second suffix.

As shown in FIG. 1, a first peripheral circuit area 11 is formed in a middle section of a subarray matrix, which extends in the row direction, and a second peripheral circuit area 12 is formed in a middle section of the subarray matrix, which extends in the column direction. The first peripheral circuit area 11 supplies a subarray control signal to each of sixteen subarrays $SA_{j,1}$ to $SA_{j,16}$ included in the j-th subarray column.

In the prior art memory chip shown in FIG. 1, the first peripheral circuit area 11 is interposed between the eighth and ninth rows of the subarray matrix and includes sense amplifiers. The second peripheral circuit area 12 is interposed between the eighth and ninth columns of the subarray matrix and includes main row decoders.

External connection pads are arranged in a middle section of the subarray matrix, which extends in the row direction. In this prior art memory chip, a first pad area 21 is formed between the fourth and fifth rows of the subarray matrix and a second pad area 22 is formed between the twelfth and thirteenth rows thereof.

Paying attention to the first subarray column as a representative example, the first peripheral circuit area 11 supplies subarray control signals from control signal drivers $DRV_1$ to $DRV_{16}$ to sixteen subarrays $SA_{1,1}$ to $SA_{1,16}$ via subarray control signal lines $S_{1,1}$ to $S_{1,16}$, respectively.

Subarray control signal lines $S_{1,1}$ to $S_{1,4}$ extend to their respective subarrays $SA_{1,1}$ to $SA_{1,4}$, which are located away from the first peripheral circuit area 11, from the first periphery circuit area 11 through the first pad area 21. Subarray control signal lines $S_{1,13}$ to $S_{1,16}$ extend to their respective subarrays $SA_{1,13}$ to $SA_{1,16}$, which are located away from the first peripheral circuit area 11, from the first periphery circuit area 11 through the second pad area 22.

In the pattern layout of the prior art memory chip, the subarray columns and the pads Pd of the first pad area 21 differ in pitch from each other. A displacement is therefore caused in the row direction between the subarray columns and pads Pd as shown in FIG. 1.

FIG. 2 is an enlarged view showing an example of the pattern layout in a neighborhood of the first pad area 21 shown in FIG. 1. As is apparent from FIG. 2, the pitch of the subarray columns and that of pads Pd of the first pad area 21 are determined independently. For the sake of simplification of layout design, a plurality of subarray control signal lines $S_{j,1}$ to $S_{j,16}$ are arranged on the j-th subarray column at the same pitches as those of the subarray columns and thus designed hierarchically.

The subarray control signal lines $S_{j,1}$ to $S_{j,16}$ on the j-th subarray column are arranged at the same pitches as those of the subarray columns, whereas the pads Pd are arranged at pitches different from those of the subarray columns. Therefore, as shown in FIG. 2, the subarray control signal lines $S_{j,1}$ to $S_{j,16}$ have to turn and detour around the pads Pd in the pad areas 21 and 22.

If some of the subarray control signal lines $S_{j,1}$ to $S_{j,16}$ are turned and detoured, then they increase in parasitic capacitance and parasitic resistance by the turn and detour thereof. The delay time of control signals of the subarray control signal lines is therefore lengthened more than that of controls signals of the subarray control signal lines that do not turn or detour around the pads. The delay time of the control signals vary with the subarray control signal lines, as does the transmission time of the control signals. It is thus difficult to design a pattern layout of subarray control signal lines in an SRAM that requires a high-speed operation.

If some the subarray control signal lines $S_{j,1}$ to $S_{j,16}$ are simply displaced without being turned, the pattern layout of subarray control signal lines of each subarray column becomes irregular and thus difficult to design.

As described above, the prior art memory chip having a flip-chip connecting structure has the following problems. When a subarray control signal line is formed between the peripheral circuit area and each of the subarrays, it is turned to make a detour around a corresponding pad in the pad area. The subarray control signals therefore vary in delay time, which makes it difficult to operate the memory chip at high speed.

BRIEF SUMMARY OF THE INVENTION

A semiconductor memory device according to an aspect of the present invention comprises a memory cell array divided into a plurality of subarrays arranged in matrix form, the plurality of subarrays making up a plurality of subarray columns and a plurality of subarray rows, a peripheral circuit area extending in a first direction in a middle section of the memory cell array, a pad area extending in the first direction in a middle section of the memory cell array, which differs from the middle section in which the peripheral circuit area is formed, and a plurality of signal lines each formed in a second direction perpendicular to the first direction so as to connect the peripheral circuit area and a corresponding one of the subarrays of the subarray columns, wherein the pad area includes a plurality of pads arranged in the first direction at pitches corresponding to those of the plurality of subarray columns, and the plurality of signal lines are each formed linearly so as to pass between the pads in the pad area.

DETAILED DESCRIPTION OF THE INVENTION

Figure 3:
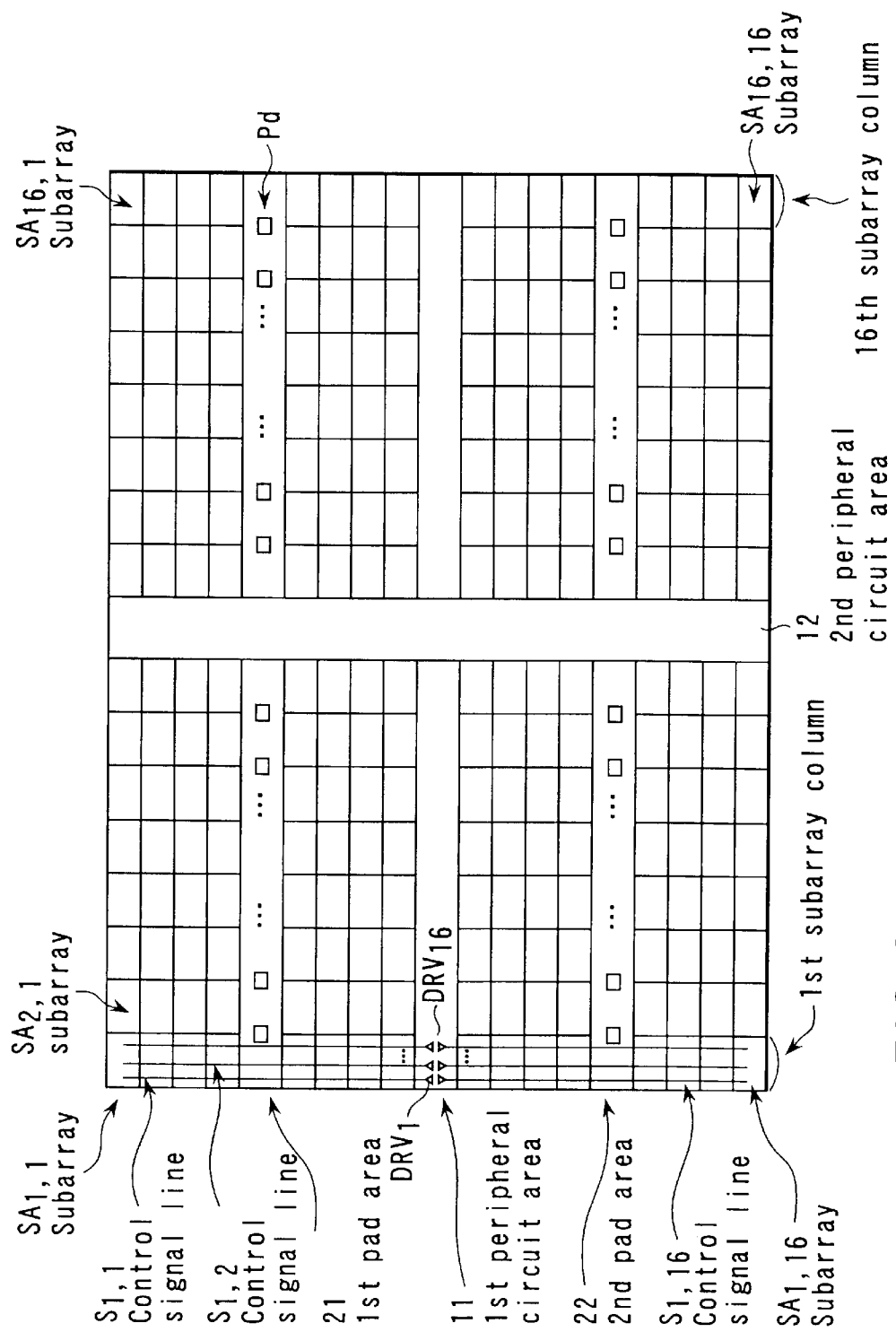
FIG. 3 is a diagram showing an example of a pattern layout of a semiconductor memory chip according to a first embodiment of the present invention.

Embodiments of the present invention will now be described with reference to the accompanying drawings.
[First Embodiment]
FIG. 3 is a diagram showing an example of a pattern layout of a semiconductor memory chip according to a first embodiment of the present invention.

The memory chip shown in FIG. 3 includes a memory cell array that is divided into a plurality of subarrays arranged in matrix form. In the first embodiment, the memory cell array is divided into subarrays $SA_{1,1}$ to $SA_{16,16}$ of a matrix with 16 rows and 16 columns. Thus, the j-th subarray column (j is an integer smaller than 17) includes sixteen subarrays $SA_{j,1}$ to $SA_{j,16}$.

A first peripheral circuit area 11 is formed in a middle section of the subarray matrix, which extends in the row direction, and a second peripheral circuit area 12 is formed in a middle section of the subarray matrix, which extends in the column direction. The first peripheral circuit area 11 supplies a subarray control signal to each of sixteen subarrays $SA_{j,1}$ to $SA_{j,16}$ included in each of the subarray columns.

According to the first embodiment, the first peripheral circuit area 11 is interposed between the eighth and ninth rows of the subarray matrix and includes sense amplifiers. The second peripheral circuit area 12 is interposed between the eighth and ninth columns of the subarray matrix and includes a main row decoders.

External connection pads are arranged in a middle section of the subarray matrix, which extends in the row direction. In the first embodiment, a first pad area 21 is formed between the fourth and fifth rows of the subarray matrix and a second pad area 22 is formed between the twelfth and thirteenth rows thereof.

Paying attention to the first subarray column as a representative example, the first peripheral circuit area 11 supplies subarray control signals from control signal drivers $DRV_1$ to $DRV_{16}$ to sixteen subarrays $SA_{1,1}$ to $SA_{1,16}$ via subarray control signal lines $S_{1,1}$ to $S_{1,16}$, respectively.

Subarray control signal lines $S_{1,1}$ to $S_{1,4}$ extend to their respective subarrays $SA_{1,1}$ to $SA_{1,4}$, which are located away from the first peripheral circuit area 11, from the first periphery circuit area 11 through the first pad area 21. Subarray control signal lines $S_{1,13}$ to $S_{1,16}$ extend to their respective subarrays $SA_{1,13}$ to $SA_{1,16}$, which are located away from the first peripheral circuit area 11, from the first periphery circuit area 11 through the second pad area 22.

Figure 1:
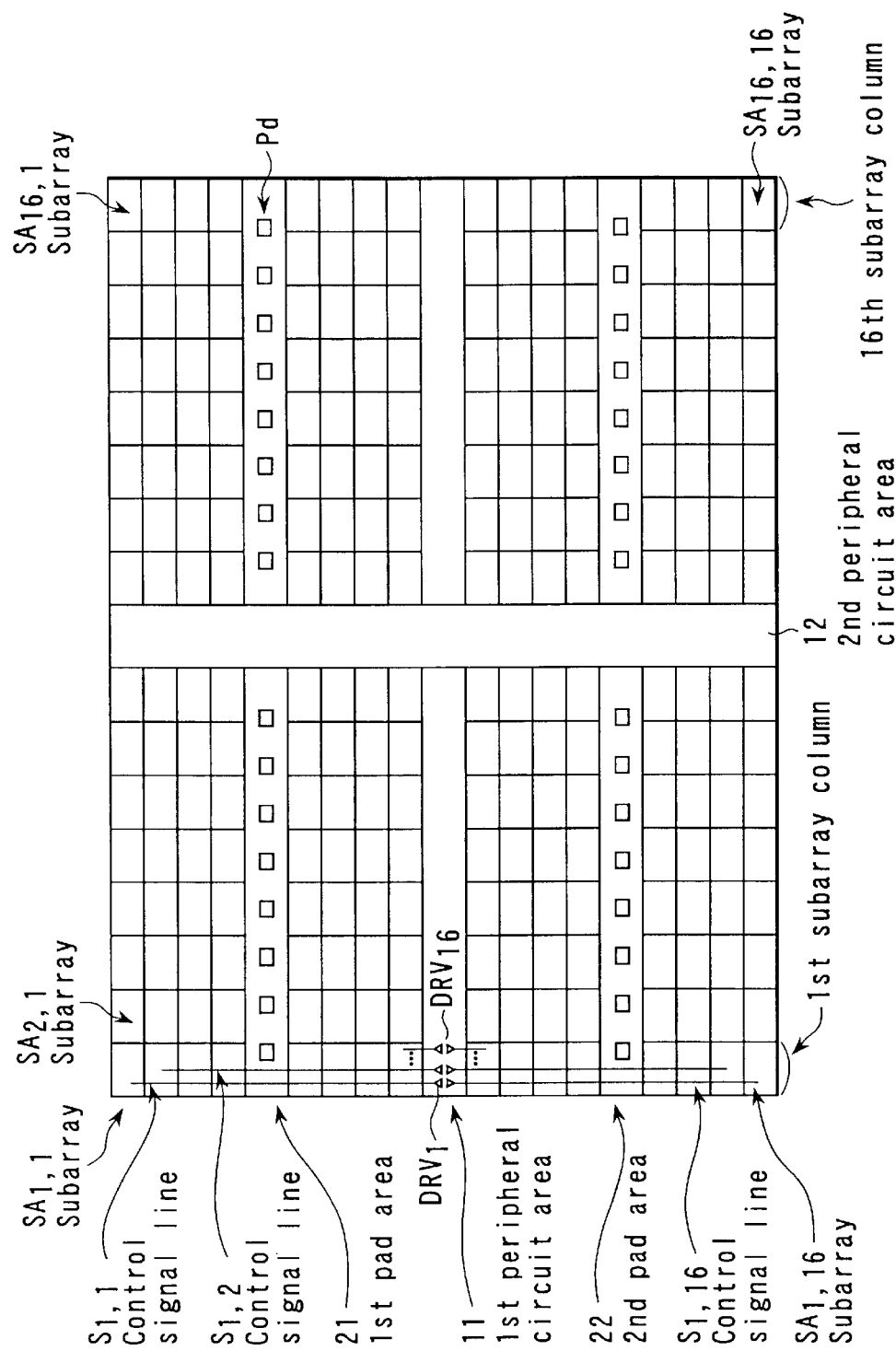
FIG. 1 is a diagram showing an example of a pattern layout of a prior art semiconductor memory chip assembled in a flip chip package.
Figure 2:
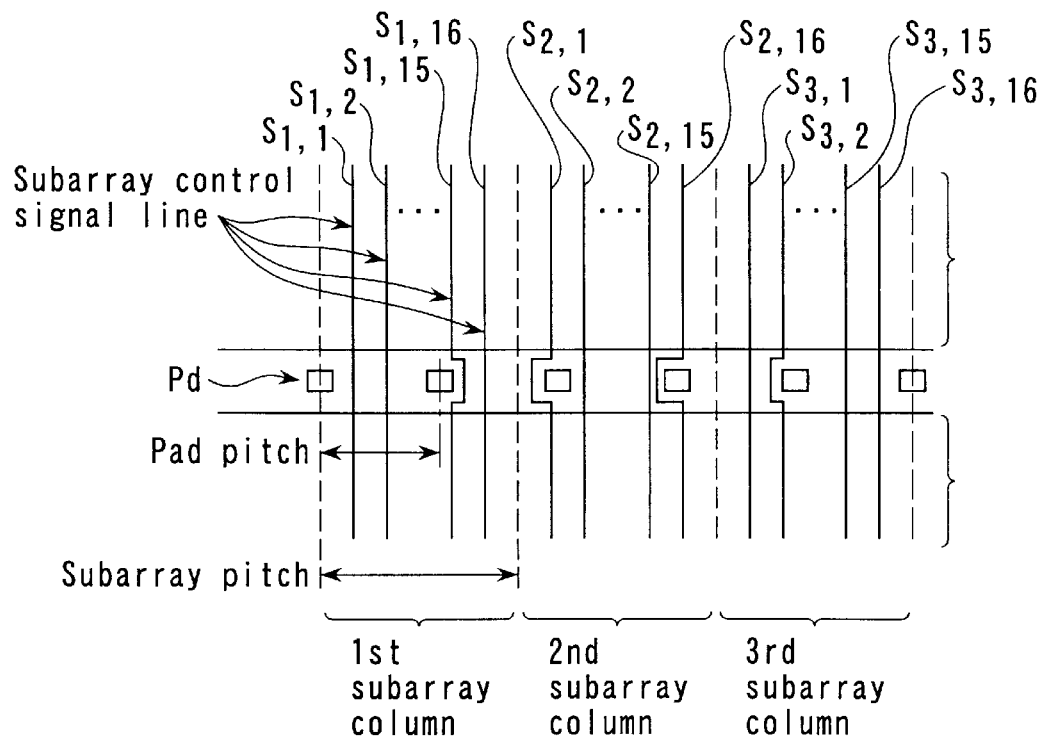
FIG. 2 is an enlarged diagram showing an example of a pattern layout in a neighborhood of a first pad area of the chip shown in FIG. 1.
Figure 4:
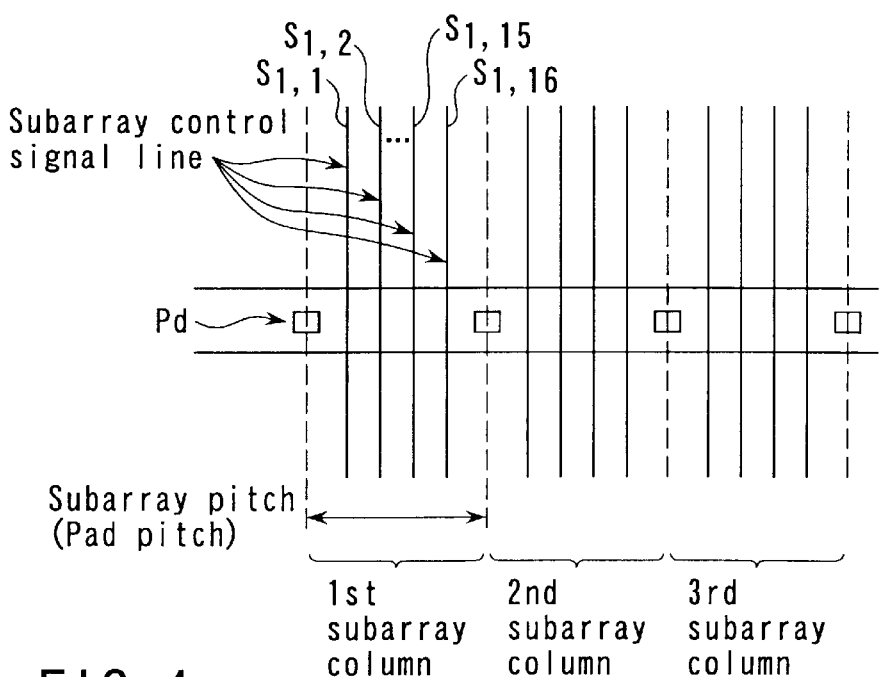
FIG. 4 is an enlarged diagram showing an example of a pattern layout in a neighborhood of a first pad area of the chip shown in FIG. 3.

FIG. 4 is an enlarged diagram showing an example of a pattern layout in a neighborhood of the first pad area 21 of the chip shown in FIG. 3.

For the sake of simplification of the layout, a plurality of subarray control signal lines $S_{j,1}$ to $S_{j,16}$ are arranged on the subarrays at the same pitches as those of the subarray columns and thus designed hierarchically.

The first pad area 21 includes a plurality of pads Pd and these pads are arranged in the row direction at the same pitches as those of the subarray columns. In the first embodiment, the pads Pd are located on their respective boundaries of the subarray columns, as indicated by the dotted lines in FIG. 4.

The second pad area 22 includes a plurality of pads Pd. The pads Pd are arranged in the row direction at the same pitches as those of the subarray columns and located on their respective boundaries of the subarray columns, as indicated by the dotted lines in FIG. 4.

At least some ($S_{j,1}$ to $S_{j,4}$ and $S_{j,13}$ to $S_{j,16}$) of the subarray control signal lines $S_{j,1}$ to $S_{j,16}$, which are connected between the first peripheral circuit area 11 and the subarrays of the subarray columns, are formed linearly such that they can pass between the pads Pd of the first pad area 21 and between the pads Pd of the second pad area 22.

In the first embodiment, all the subarray control signal lines $S_{j,1}$ to $S_{j,16}$ are formed to have the same length as that of a signal line connecting the subarrays $SA_{j,1}$ and $SA_{j,16}$ that are farthest from the first peripheral circuit area 11. Furthermore, all the subarray control signal lines $S_{j,1}$ to $S_{j,16}$ are formed linearly such that they can pass between the pads Pd.

The memory chip according to the first embodiment can be summarized as follows. The memory cell array is divided into subarrays $SA_{1,1}$ to $SA_{16,16}$ arranged in matrix form. The peripheral circuit areas 11 and 12 and pad areas 21 and 22 are formed in the middle sections of the subarray matrix. In the pad areas 21 and 22, the plurality of pads Pd are arranged at the same pitches as those of the subarrays, and the subarray control signal lines $S_{j,1}$ to $S_{j,16}$, which connects the peripheral circuit area 11 and each of the subarrays, are linearly formed such that they can pass between the pads Pd. The same pattern can thus be designed for each subarray column in laying out the subarray control signal lines $S_{j,1}$ to $S_{j,16}$.

Since the subarray control signal lines $S_{j,1}$ to $S_{j,16}$ are not turned so as to detour around the pads of the pad areas 21 and 22 formed halfway through the subarray columns, they can be prevented from increasing in parasitic capacitance and parasitic resistance. Thus, the variations of delay time of subarray control signals supplied to the subarrays can be suppressed, with the result that a high-speed memory chip can be designed.

In order to achieve a high-speed memory such as an SRAM, an SRAM chip capable of a high-speed operation as in the first embodiment is formed. Then, the SRAM chip is bonded to a chip assembly substrate (not shown) by flip chip bonding and assembled in a package (usually resin-molded).

The subarray control signal lines $S_{j,1}$ to $S_{j,16}$ are formed to have the same length as that of a signal line connecting the subarrays that are farthest from the first peripheral circuit area 21, thereby keeping the parasitic capacitances and parasitic resistances of the respective signal lines constant.

When the need arises, the parasitic capacitances and parasitic resistances of the signal lines can be decreased by causing the subarray control signal lines $S_{j,1}$ to $S_{j,16}$ to differ in length from each other in accordance with the distance between the peripheral circuit area and each of the subarrays.

In the foregoing memory chip according to the first embodiment, the subarray control signal lines for selecting or activating a subarray and supplying a subarray control signal (part of address signals) are formed linearly. However, data signal lines for transmitting a write data signal and/or a read data signal between the peripheral circuit area and each of the subarrays can be formed linearly.

[First Modification to Pad Area]

Figure 5:
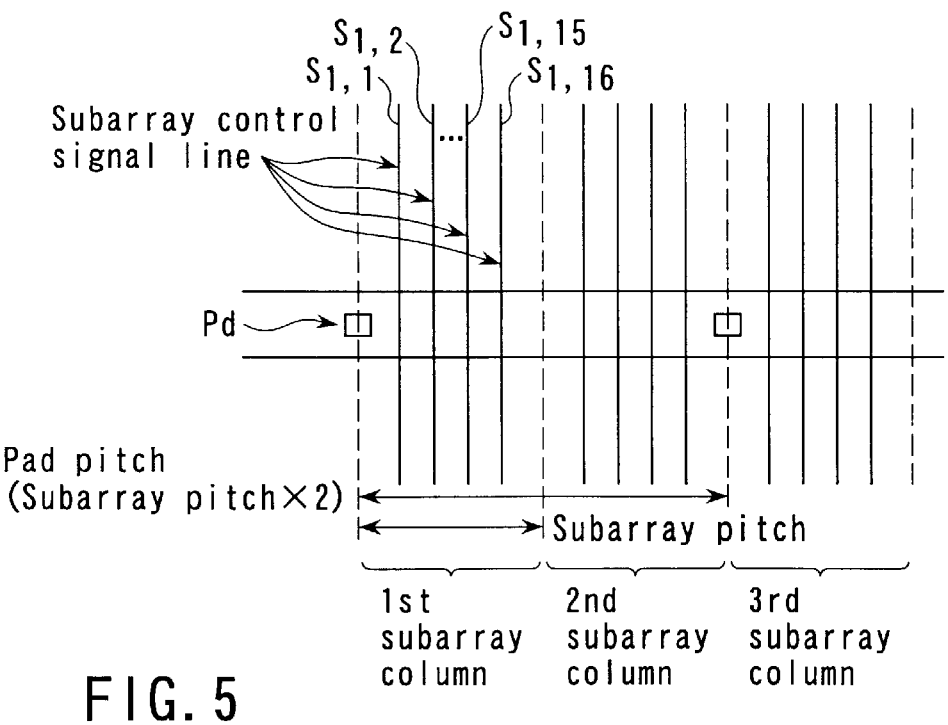
FIG. 5 is a diagram showing a first modification to the pattern layout in the neighborhood of the first pad area of the chip shown in FIG. 3.

FIG. 5 is a diagram showing a first modification to the pattern layout in the neighborhood of the first pad area 21 shown in FIG. 3.

The pad area shown in FIG. 5 differs from that shown in FIG. 4 in that its pads Pd are arranged at pitches twice as large as those of the subarrays. In the first modification, each of the pads Pd is located on a boundary between two sets of subarray columns. Except for this, the pad area shown in FIG. 5 is the same as that shown in FIG. 4 and thus the same components as those of FIG. 4 are denoted by the same reference numerals.

A plurality of subarray control signal lines $S_{j,1}$ to $S_{j,16}$ can be formed linearly so as to pass between the pads Pd in the pad area as in that shown in FIG. 4. Therefore, a high-speed memory chip can be designed.

[Second Modification to Pad Area]

Figure 6:
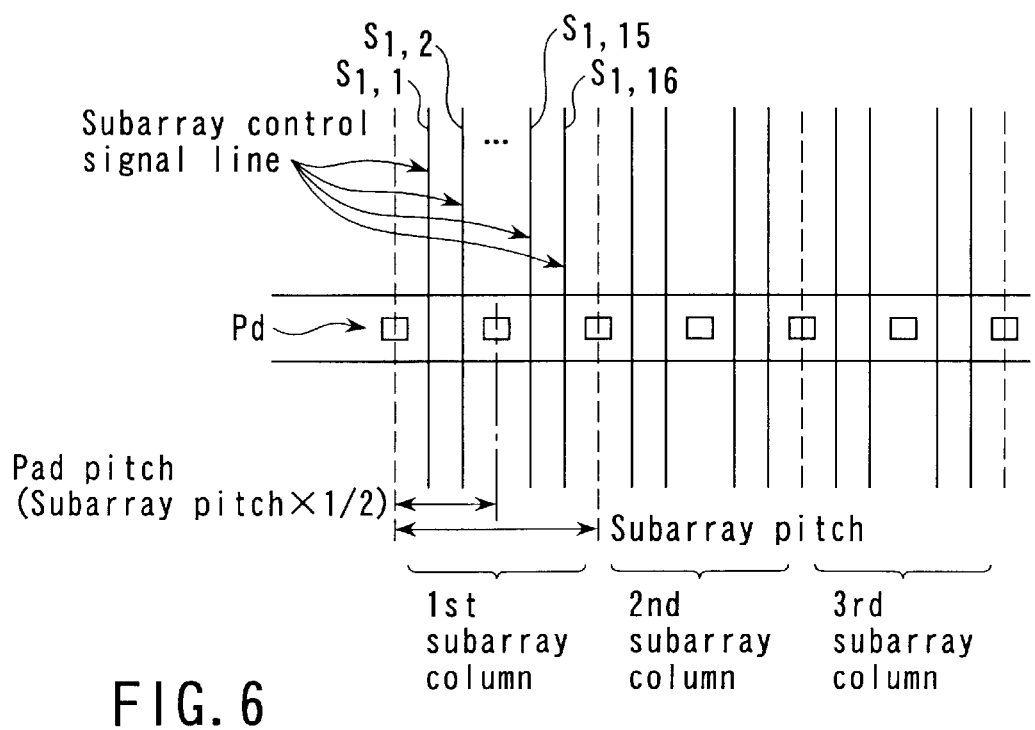
FIG. 6 is a diagram showing a second modification to the pattern layout in the neighborhood of the first pad area of the chip shown in FIG. 3.

FIG. 6 is a diagram showing a second modification to the pattern layout in the neighborhood of the first pad area 21 shown in FIG. 3.

The pad area shown in FIG. 6 differs from that shown in FIG. 4 in that its pads Pd are arranged at half the pitches of the subarrays. In the first modification, each of the pads Pd is located on a boundary between two subarray columns and halfway between adjacent boundaries. Except for this, the pad area shown in FIG. 6 is the same as that shown in FIG. 4 and thus the same components as those of FIG. 4 are denoted by the same reference numerals.

A plurality of subarray control signal lines $S_{j,1}$ to $S_{j,16}$ can be formed linearly so as to pass between the pads Pd in the pad area as in that shown in FIG. 4 or 5. Therefore, a high-speed memory chip can be designed.

As described above, according to the semiconductor memory device of the present invention, a signal line connecting the peripheral circuit area and each of the subarrays can be formed linearly so as to pass between pads in the pad area, which is formed halfway through the subarray columns, without turning or detouring around the pads. Thus, the variations of delay time of signals supplied to the subarrays are avoided and the transmission time of signals is fixed, thereby achieving a high-speed operation.

What is claimed is:

1. A semiconductor memory device comprising:
   a memory cell array divided into a plurality of subarrays arranged in matrix form, the plurality of subarrays making up a plurality of subarray columns and a plurality of subarray rows;
   a peripheral circuit area extending in a first direction in a middle section of said memory cell array;
   a pad area extending in the first direction in a middle section of said memory cell array, which differs from the middle section in which said peripheral circuit area is formed; and
   a plurality of signal lines each formed in a second direction perpendicular to the first direction so as to connect said peripheral circuit area and a corresponding one of the subarrays of the subarray columns,
   wherein said pad area includes a plurality of pads arranged in the first direction at pitches corresponding to those of said plurality of subarray columns, and said plurality of signal lines are each formed linearly so as to pass between the pads in said pad area.

2. The semiconductor memory device according to claim 1, wherein said plurality of signal lines have a same layout pattern for each of said subarray columns.

3. The semiconductor memory device according to claim 1, wherein said plurality of signal lines have a same length as that of a signal line connecting subarrays that are farthest from said peripheral circuit area in each of said subarray columns.

4. The semiconductor memory device according to claim 1, wherein said pad area includes pads arranged in the first direction at same pitches as those of the subarray columns.

5. The semiconductor memory device according to claim 4, wherein said plurality of signal lines have a same layout pattern for each of said subarray columns.

6. The semiconductor memory device according to claim 4, wherein said plurality of signal lines have a same length as that of a signal line connecting subarrays that are farthest from said peripheral circuit area in each of said subarray columns.

7. The semiconductor memory device according to claim 4, wherein said pads are each arranged on a boundary between subarray columns.

8. The semiconductor memory device according to claim 7, wherein said plurality of signal lines have a same layout pattern for each of said subarray columns.

9. The semiconductor memory device according to claim 7, wherein said plurality of signal lines have a same length as that of a signal line connecting subarrays that are farthest from said peripheral circuit area in each of said subarray columns.

10. The semiconductor memory device according to claim 1, wherein said pad area includes pads arranged in the first direction at pitches that are an integral multiple of those of the subarray columns.

11. The semiconductor memory device according to claim 10, wherein said plurality of signal lines have a same layout pattern for each of said subarray columns.

12. The semiconductor memory device according to claim 10, wherein said plurality of signal lines have a same length as that of a signal line connecting subarrays that are farthest from said peripheral circuit area in each of said subarray columns.

13. The semiconductor memory device according to claim 1, wherein said pad area includes pads arranged in the first direction at pitches that are an integral submultiple of those of the subarray columns.

14. The semiconductor memory device according to claim 13, wherein said plurality of signal lines have a same layout pattern for each of said subarray columns.

15. The semiconductor memory device according to claim 13, wherein said plurality of signal lines have a same length as that of a signal line connecting subarrays that are farthest from said peripheral circuit area in each of said subarray columns.

16. The semiconductor memory device according to claim 1, wherein said plurality of signal lines are subarray control signal lines to transfer some of address signals to select and activate corresponding subarrays connected thereto.

17. The semiconductor memory device according to claim 1, wherein said plurality of signal lines are data signal lines to transfer a write data signal and/or a read data signal between subarrays connected thereto.

* * * * *